United States Patent
Yen

(10) Patent No.: US 7,068,064 B1
(45) Date of Patent: Jun. 27, 2006

(54) MEMORY MODULE WITH DYNAMIC TERMINATION USING BUS SWITCHES TIMED BY MEMORY CLOCK AND CHIP SELECT

(75) Inventor: Yao Tung Yen, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 152 days.

(21) Appl. No.: 10/710,475

(22) Filed: Jul. 14, 2004

Related U.S. Application Data

(63) Continuation-in-part of application No. 10/707,249, filed on Dec. 1, 2003, now Pat. No. 6,927,992, which is a continuation-in-part of application No. 10/249,845, filed on May 12, 2003, now Pat. No. 6,947,304.

(51) Int. Cl.
*H03K 19/03* (2006.01)
*H03K 17/16* (2006.01)
*G11C 5/06* (2006.01)

(52) U.S. Cl. .............. 326/30; 326/28; 365/63; 365/233

(58) Field of Classification Search ............ 326/26, 326/27, 28, 30, 93; 365/63, 51, 233, 230.03; 361/788; 710/107
See application file for complete search history.

(56) References Cited

U.S. PATENT DOCUMENTS

| | | | |
|---|---|---|---|
| 5,227,677 A | 7/1993 | Furman | 326/21 |
| 5,729,152 A | 3/1998 | Leung et al. | 326/21 |
| 6,072,342 A | 6/2000 | Haider et al. | 327/112 |
| 6,266,252 B1 | 7/2001 | Karabatsos | 361/788 |
| 6,356,106 B1 * | 3/2002 | Greeff et al. | 326/30 |
| 6,429,678 B1 | 8/2002 | Wong et al. | 326/30 |
| 6,538,951 B1 | 3/2003 | Janzen et al. | 365/230.03 |
| 6,686,763 B1 | 2/2004 | Yen | 326/30 |
| 6,714,465 B1 | 3/2004 | Jang | 365/194 |
| 6,738,844 B1 | 5/2004 | Muljono et al. | 710/107 |
| 6,839,786 B1 * | 1/2005 | Kim et al. | 710/300 |

* cited by examiner

*Primary Examiner*—Daniel Chang
(74) *Attorney, Agent, or Firm*—Stuart T. Auvinen

(57) ABSTRACT

A low-power memory module has an active termination circuit at each end of critical signal traces. The dynamic termination circuit has a low-value resistor that is connected to a termination voltage by a transmission gate that is turned on by a switch signal. The switch signal is activated when the memory module is selected by a chip-select signal, and when a time window is open. The time window is generated from the clock to synchronous DRAMs on the memory module. The time window can be one-quarter of the clock period by ANDing the clock and a delayed clock that is delayed by one-quarter of a cycle. A static terminating resistor in parallel with the low-value resistor provides a much smaller terminating current that is not switched on and off. Traces can be impedance-matched at junctions to branches that each has a dynamic termination circuit at the far end.

25 Claims, 7 Drawing Sheets

MEMORY MODULE WITH DYNAMIC TERMINATION USING BUS SWITCHES TIMED BY MEMORY CLOCK AND CHIP SELECT

CROSS REFERENCE TO RELATED APPLICATIONS

This application is a continuation-in-part of the application for "Trace-Impedance Matching at Junctions of Multi-Load Signal Traces to Eliminate Termination", U.S. Ser. No. 10/707,249, filed Dec. 1, 2003 is now a U.S. Pat. No. 6,927,992, which is a continuation-in-part of the application for "DDR Memory Modules With Input Buffers Driving Split Traces with Trace-Impedance Matching at Trace Junctions", U.S. Ser. No. 10/249,845, filed May 12, 2003 is now a U.S. Pat. No. 6,947,304.

BACKGROUND OF INVENTION

This invention relates to memory modules, and more particularly to dynamic, timed termination circuits.

Personal computers (PCs) and other electronic systems often use memory modules such as dual-inline memory modules (DIMMs). Memory modules have memory chips such as dynamic-random-access memories (DRAMs) mounted on a small printed-circuit board (PCB) or other substrate. Contact pads along one edge of the substrate make electrical contact when the memory module is plugged into a socket such as on a PC motherboard.

As these electronic systems operate at higher and higher speeds, signals driven to the memory modules must also operate at higher frequencies. Faster high-current drivers can be used to more rapidly drive current to charge and discharge the capacitances on the inputs of DRAM chips on the memory modules. These DRAM-input capacitances can be significant, producing a large capacitive load on the inputs to the memory modules, especially when many DRAM chips are mounted on the same memory module.

As clock rates rise above 100 MHz, metal traces on circuit boards behave as transmission lines, exhibiting reflections, undershoot, overshoot, and ringing that distort signals. This can be true of memory modules operating at higher frequencies. Transmission-line techniques such as termination resistors may be added to signal lines on memory modules to suppress reflections and other transmission-line effects.

FIG. 1A shows a terminated signal trace on a typical memory module. Buffer 10 on a memory module substrate or on a motherboard drives near end 12 of a metal trace or line. DRAM chips 14 each have an input connected to the metal line between near end 12 and far end 16. DRAM chips 14 can be clocked or synchronous DRAM chips (SDRAM). The line between ends 12, 16 may be an address line, but could be other address or control lines generated by a memory controller on a PC motherboard.

Contact pads along an edge of the memory module make electrical contact with metal tabs inside the memory module socket. When buffer 10 is mounted on the memory module substrate, the contact pads connect to traces to inputs of buffers such as buffer 10. Other signals may connect directly to DRAM chips 14 without on-substrate buffering. Some DIMM modules may have fewer or more DRAM chips than the 9 shown in this example.

To suppress reflections along the line between ends 12, 16, resistor 18 is added to far end 16. Resistor 18 may connect to a middle voltage such as Vtt, which can be half of the Vcc power supply. Other systems may use some other voltage for Vtt, even power or ground.

FIG. 1B is a waveform showing termination currents. When the signal applied to DRAM chips 14 rises from ground to Vcc, the voltage at far end 16 rises, as shown in waveform 20. Current through resistor 18 reverses direction as the far-end voltage rises above Vtt, as shown in waveform 22.

Termination Itt current initially flows in a positive direction from Vtt, through resistor 18 to the grounded line at far end 16, but stops flowing when the voltage at far end 16 rises to Vtt. As the far-end voltage continues to rise above Vtt, current flows from far end 16, through resistor 18 to Vtt, which is now at a lower voltage. This is considered to be negative current, −Itt.

Termination current remains −Itt while far end 16 is high, even though no switching is occurring. When buffer 10 switches to driving near end 12 high-to-low, as far end 16 falls in voltage the termination current again switches direction. Once far end 16 is driven to ground, the maximum termination current, +Itt, flows through resistor 18.

Thus termination current is at maximum absolute values when switching stops. Current is continuously drawn through termination resistor 18 when address signals to DRAMs 14 are staying high or low. This can be a serious power drain from the termination voltage source, and a significant amount of heat can be generated by resistor 18 and other termination resistors that must be dissipated by a heat sink attached to the memory module.

The termination current is +/−Itt when far end 16 is high or low. This can be a substantial current. For example, resistor 18 may have a value of 50 ohms to match the trace impedance between ends 12, 16. Vtt may be set to 0.9 volt for a 1.8-volt Vcc supply. The current Itt is V/R or 0.9/50=18 mA. This is the current through one termination resistor for one signal line. A memory module may have many address and control lines, each having two far ends when lines are driven from the middle, requiring as many as 50 termination resistors. The total termination current on one memory module may approach 1 Amp. Some memory modules have large cumbersome heat sinks attached to dissipate the heat generated in part from such large termination currents.

Active termination circuits can be used in place of static termination resistors. See for example U.S. Pat. No. 6,686,763 by Yen, and assigned to Pericom Semiconductor Corp. This active termination circuit uses a transition detector to switch the active termination on and off. Transitions on the line being terminated are detected and used to turn on the active termination. While useful, the transition detector may be triggered by noise on the line, and may not be on for the very start of a transition.

What is desired is an active terminator for memory modules. A dynamic termination circuit that uses the synchronous nature of SDRAM chips is desired rather than a transition-detector-based active terminator.

DETAILED DESCRIPTION

The present invention relates to an improvement in memory module terminators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the synchronous nature of SDRAMs may be used to generate timing for activating an active termination circuit for a memory module. The dynamic termination is enabled only when chips on the memory module are selected by the chip-select signal. Also, even when enabled by chip-select, the dynamic termination is activated only during portions of the SDRAM clock period, and not during other portions. For example, termination is activated during the pulse-high portion and disabled during the pulse-low period of the SDRAM clock, since address and control signals change in response to the rising edge of the SDRAM clock.

Figure 1A:
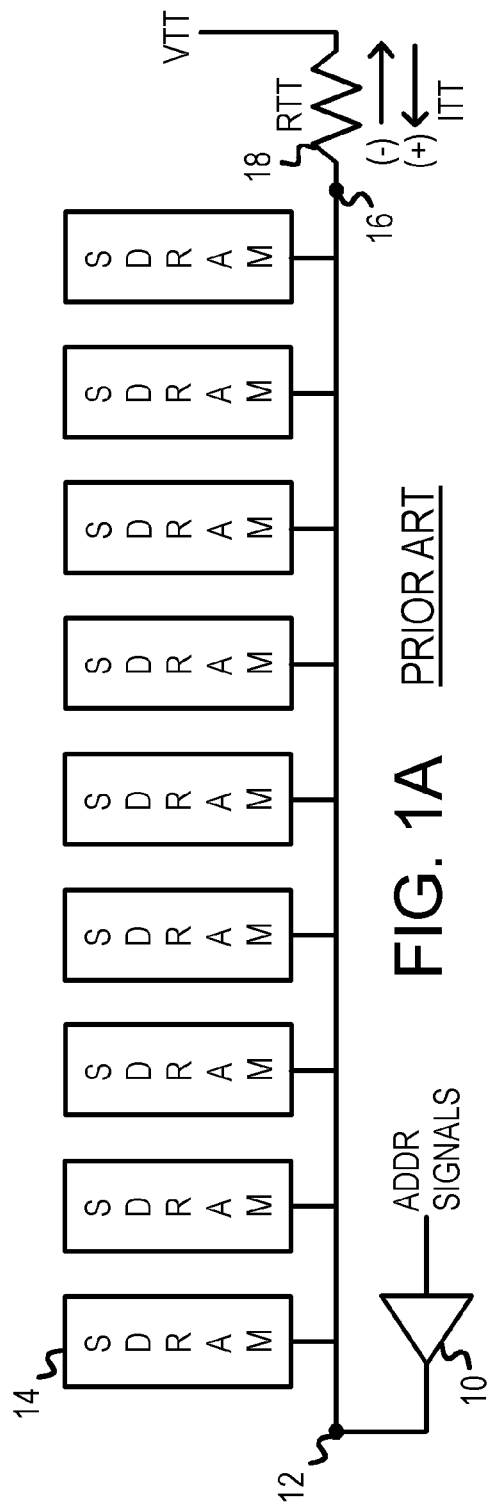
FIG. 1A shows a terminated signal trace on a typical memory module.
Figure 1B:
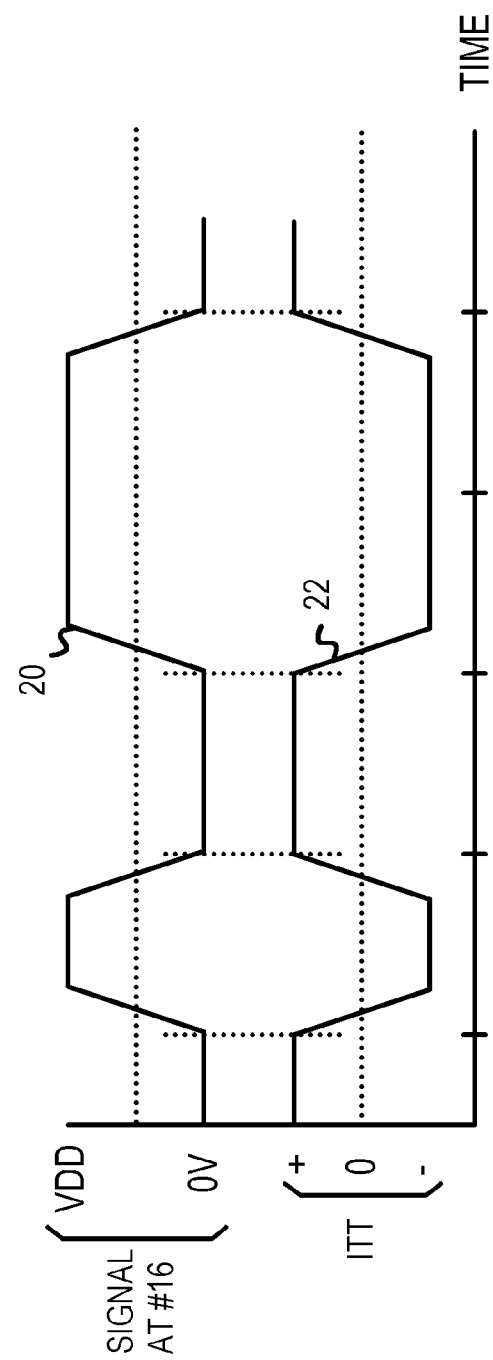
FIG. 1B is a waveform showing termination currents.
Figure 2A:
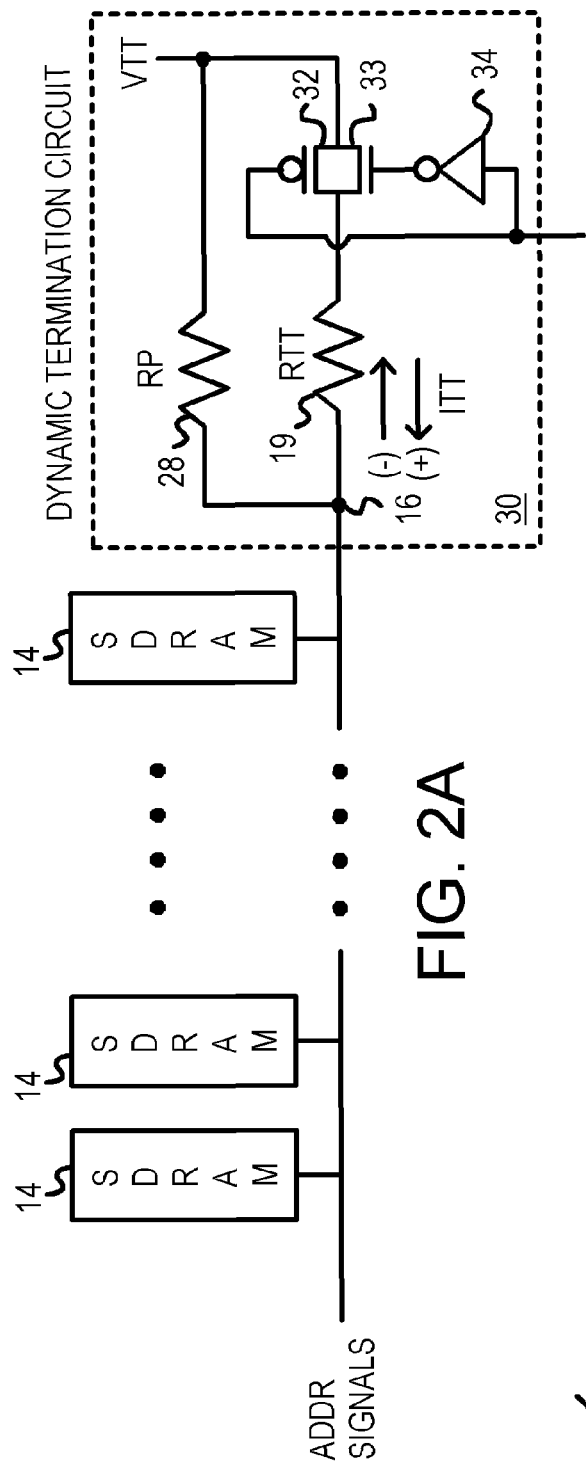
FIG. 2A shows a memory module signal with a dynamic termination circuit.

FIG. 2A shows a memory module signal with an active or dynamic termination circuit. A control or address signal is applied to inputs of synchronous DRAM chips 14 on a memory module. Far end 16 of the control or address line has dynamic termination circuit 30 attached. Dynamic termination circuit 30 has two resistors in parallel to terminating voltage Vtt, which may be set to half of Vcc.

Static terminating resistor 28 connects between far end 16 and voltage Vtt, but has a relatively large resistance value Rp. Dynamic terminating resistor 19 is in parallel with static terminating resistor 28, but is connected to voltage Vtt through a transmission gate of p-channel transistor 32 and n-channel transistor 33. Inverter 34 inverts switch signal SW to drive the gate of n-channel transistor 33, while signal SW drives the gate of p-channel transistor 32 directly.

When switch signal SW is low, both transistors 32, 33 are turned on, causing dynamic terminating resistor 19 to conduct current between far end 16 and voltage Vtt. Current flows in parallel through both resistors 19, 28, but since the resistance value Rtt of dynamic terminating resistor 19 is much lower than resistance value Rp of static terminating resistor 28, most current flows through dynamic terminating resistor 19. For example, dynamic terminating resistor 19 can be 50 ohms, while static terminating resistor 28 is 1K to 100K ohms.

When switch signal SW is high, both transistors 32, 33 are turned off, causing dynamic terminating resistor 19 to not conduct current. Only static terminating resistor 28 conducts between far end 16 and voltage Vtt. The total terminating current drops to 0.9 mA (1K-ohm) to 9 µA (100K-ohm).

When SW is low, a large terminating current of 18 mA is supplied by dynamic termination circuit 30, but when SW is high, a small terminating current of less than 1 mA is supplied. Thus terminating current and power are significantly reduced when SW is high.

Figure 2B:
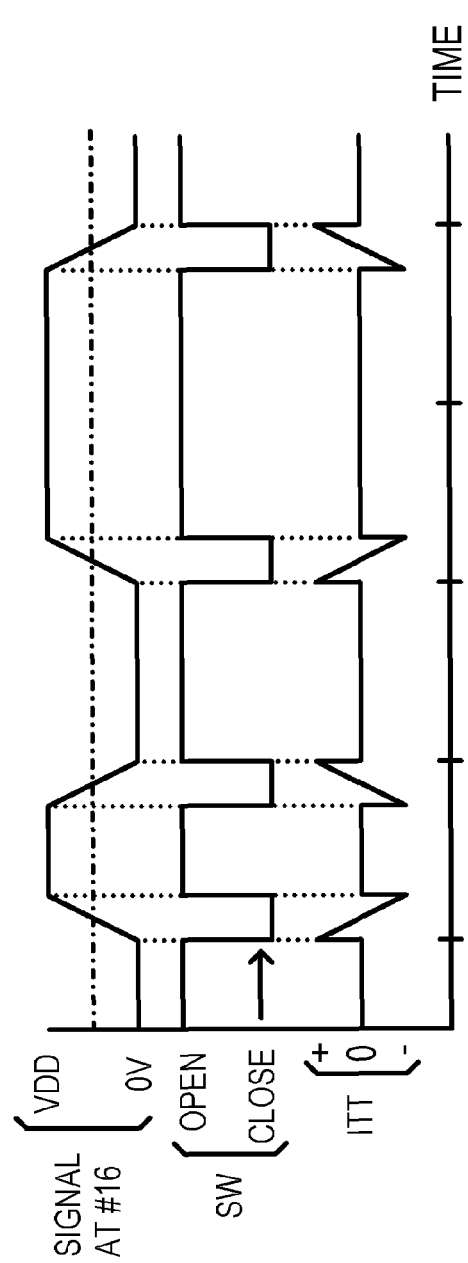
FIG. 2B is a waveform showing one possible timing of the dynamic termination circuit of FIG. 2A.

FIG. 2B is a waveform showing one possible timing of the dynamic termination circuit of FIG. 2A. Ideally, when far end 16 is switching from low-to-high, or from high-to-low, the dynamic termination circuit is enabled by SW being low. At all other times SW is high to turn off the higher termination current through dynamic terminating resistor 19. The terminating current Itt through dynamic terminating resistor 19 is zero when SW is high, but varies when SW is low. For example, when the far-end voltage rises, Itt jumps to a high positive value as soon as SW turns on transistors 32, 33. Then Itt falls to zero as the voltage of far end 16 crosses Vtt. Current Itt becomes more negative as the far-end voltage rises above Vtt until it reaches a maximum negative value when the far-end voltage reaches Vcc. Then SW is driven high, turning off the high terminating current through dynamic terminating resistor 19.

Only a small terminating current flows through static terminating resistor 28 when SW is high. Power is greatly reduced when SW is high. Since the time of transition of far-end 16 is a relatively small fraction of the total time, power can be reduced by disabling the large terminating current through dynamic terminating resistor 19. When the control or address signal transitions, a large terminating current is provided to suppress ringing and other transmission-line effects, as long as signal SW is drive low at the proper time.

Figure 3:
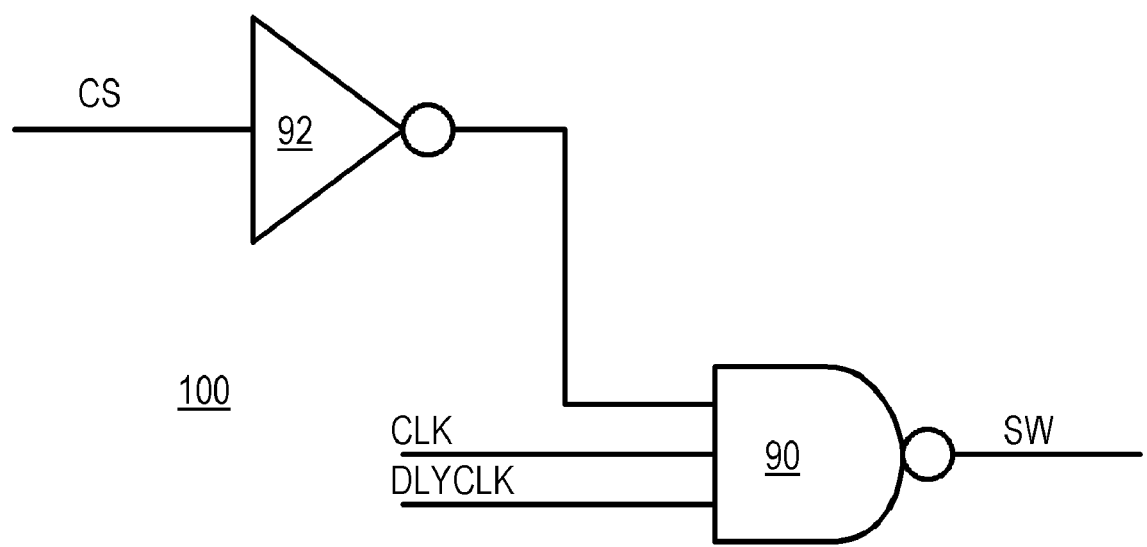
FIG. 3 is a circuit that generates switch signal SW that enables the dynamic termination circuit of FIG. 2A.

FIG. 3 is a circuit that generates switch signal SW that enables the dynamic termination circuit of FIG. 2A synchronously to the SDRAM clock. Chip-select signal CS is active-low and selects one bank of DRAM for access. The address and other control signals may be shared among several banks of DRAM, so a bank that is not activated (has its CS high) may still see address and control-signal transitions. Thus disabling the dynamic termination circuit when CS is high can eliminate power drain for inactive banks. The power savings can be significant. For example, a 4-bank system assuming evenly-distributed address accesses can reduce power consumption by more than 75% by gating the dynamic termination with each bank's CS.

Chip-select signal CS is inverted by inverter 92 and the active-high output is input to NAND gate 90. The output of NAND gate 90 is switch signal SW, which disables the dynamic termination circuit when SW is high. When CS is high, inverter 92 drives a low to NAND gate 90, which forces its output high. Thus switch-generation logic 100 disables the dynamic termination circuit when CS is inactive.

NAND gate 90 also receives two timing signals. CLK is the clock applied to the SDRAM chips, while DLYCLK is CLK delayed by about a quarter-cycle. DLYCLK can be generated by an analog delay line or can be derived from a higher-speed clock. When both CLK and DLYCLK are high, NAND gate 90 can drive its output low. Thus SW is low, activating the dynamic termination circuit, when CS is low and CLK and DLYCLK are both high. This can occur only during one-quarter of the period of CLK. Thus termination can only be active for one-quarter of the clock period. This time window reduces power consumption of the dynamic termination circuit by 75%.

Overall power consumption by the dynamic termination circuit is thus reduced by 75% because the dynamic termination circuit is enabled only for a time window of one-quarter of a clock period, and by an additional amount that depends on the amount of time that CS is active. This additional amount may be a factor of about (N−1)/N, where N is the number of banks. For a 4-bank system, power is thus only ¼×¼, or 6% of the original power, a 94% reduction.

Figure 4:
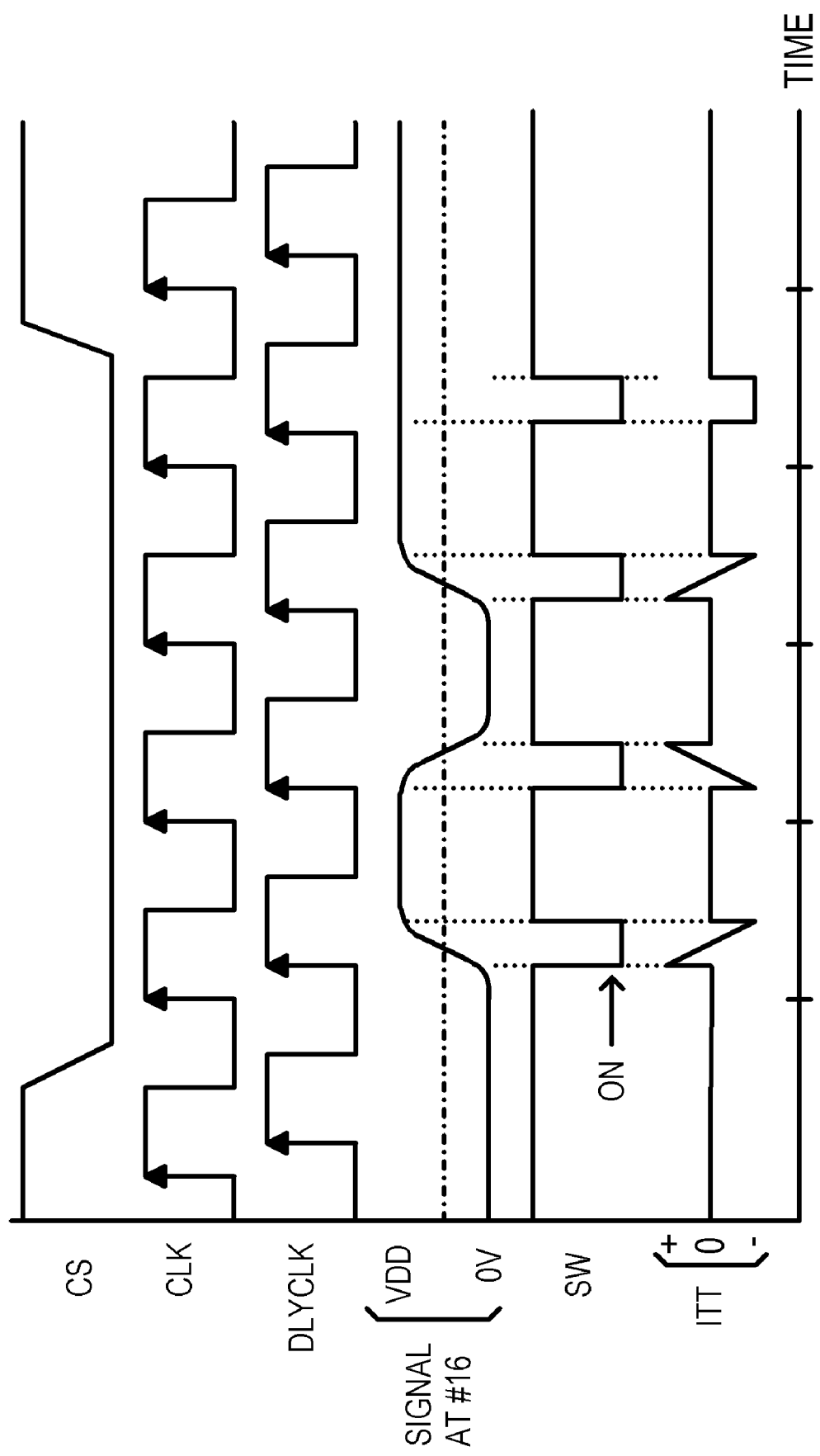
FIG. 4 is a timing waveform showing operation of the dynamic termination circuit of FIG. 2A.

FIG. 4 is a timing waveform showing operation of the dynamic termination circuit of FIG. 2A using the switch signal generated by the logic of FIG. 3. When chip-select CS is high, the bank of DRAMs is de-selected, and dynamic termination circuit 30 is disabled. Switch signal SW remains high.

When chip-select CS goes low, the DRAM is selected and switch signal SW is pulsed low when both CLK and DLYCLK are high. Both clocks are low for one-quarter of the clock period, during the second of the four quarter-periods. This time is when the address and control signals are changing, since these signals are synchronized to CLK.

The termination current Itt is near-zero most of the time, when switch signal SW is high. When SW goes low, Itt increases, and either falls from a large positive value, through zero to a large negative value (for a rising edge of far-end signal 16), or rises from a large negative value, through zero to a large positive value (for a falling edge of far-end signal 16).

When the address or control signal does not change when SW is active (low), the termination current remains high during the duration of the SW pulse. When CS is high (deselect), the termination current is near-zero regardless of whether far-end signal 16 is high or low. The termination current has a small negative or positive value due to the small current through static terminating resistor 28 when dynamic terminating resistor 19 is disconnected by SW being high.

Figure 5:
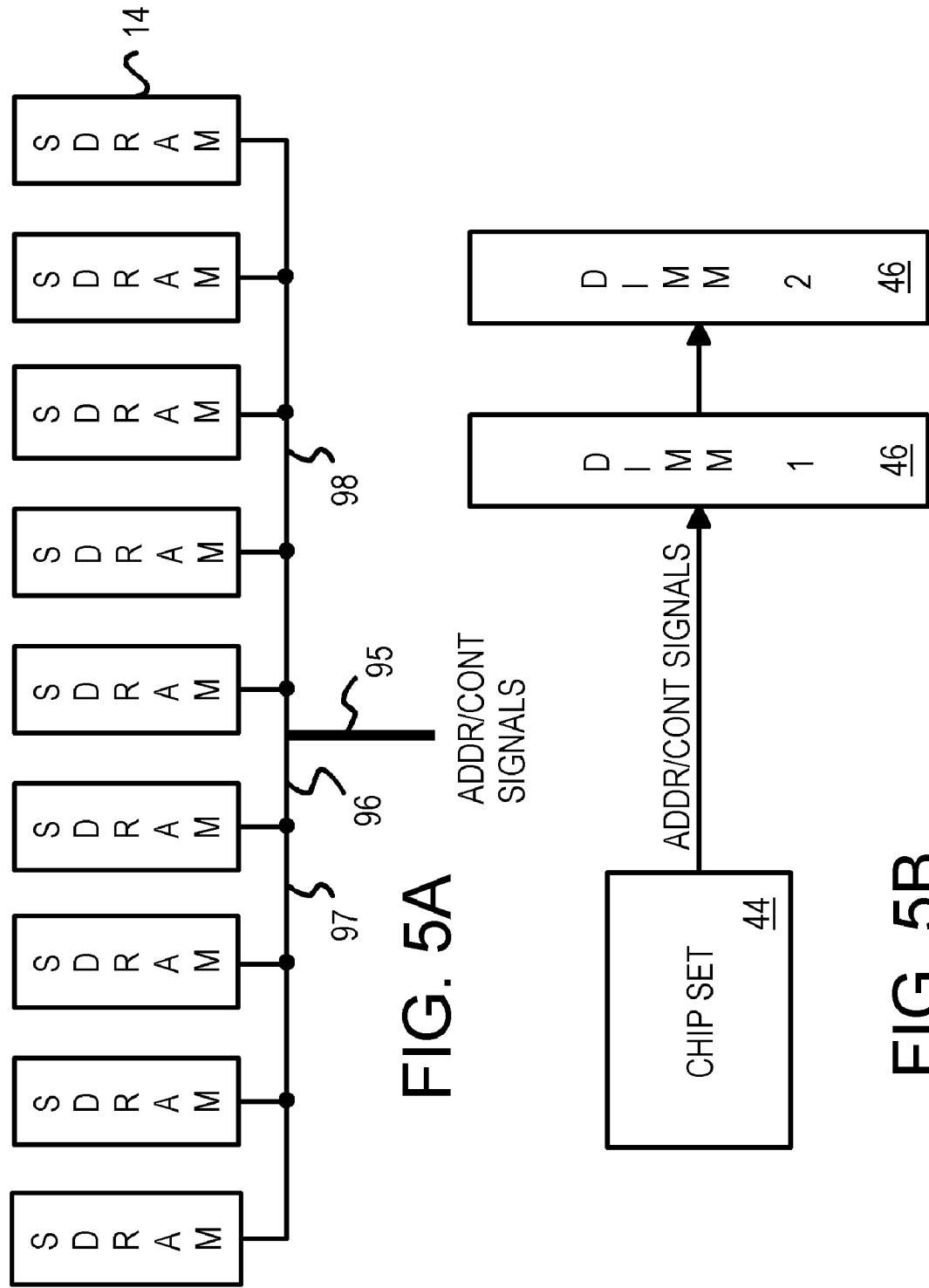
FIG. 5A shows an unbuffered memory module.
FIG. 5B shows a chip set driving multiple memory modules.

FIG. 5A shows an unbuffered memory module. Input line 95 drives all 9 DRAM chips 14. Trace-matching described in the parent applications may be employed to reduce junction reflections due to impedance mis-match at the junctions. Trunk line 95 can be made to have the same impedance as the parallel connection of the two branch lines 97, 98. For example, when branch lines 97, 98 each have 60-ohm impedance, trunk line 95 can have a 30-ohm impedance.

FIG. 5B shows a chip set driving multiple DIMM memory modules. Chip set 44 generates and drives control and address signals to multiple memory modules, including modules 46. This fan-out increases the capacitive loading of signal lines and can limit high-speed performance.

Figure 6:
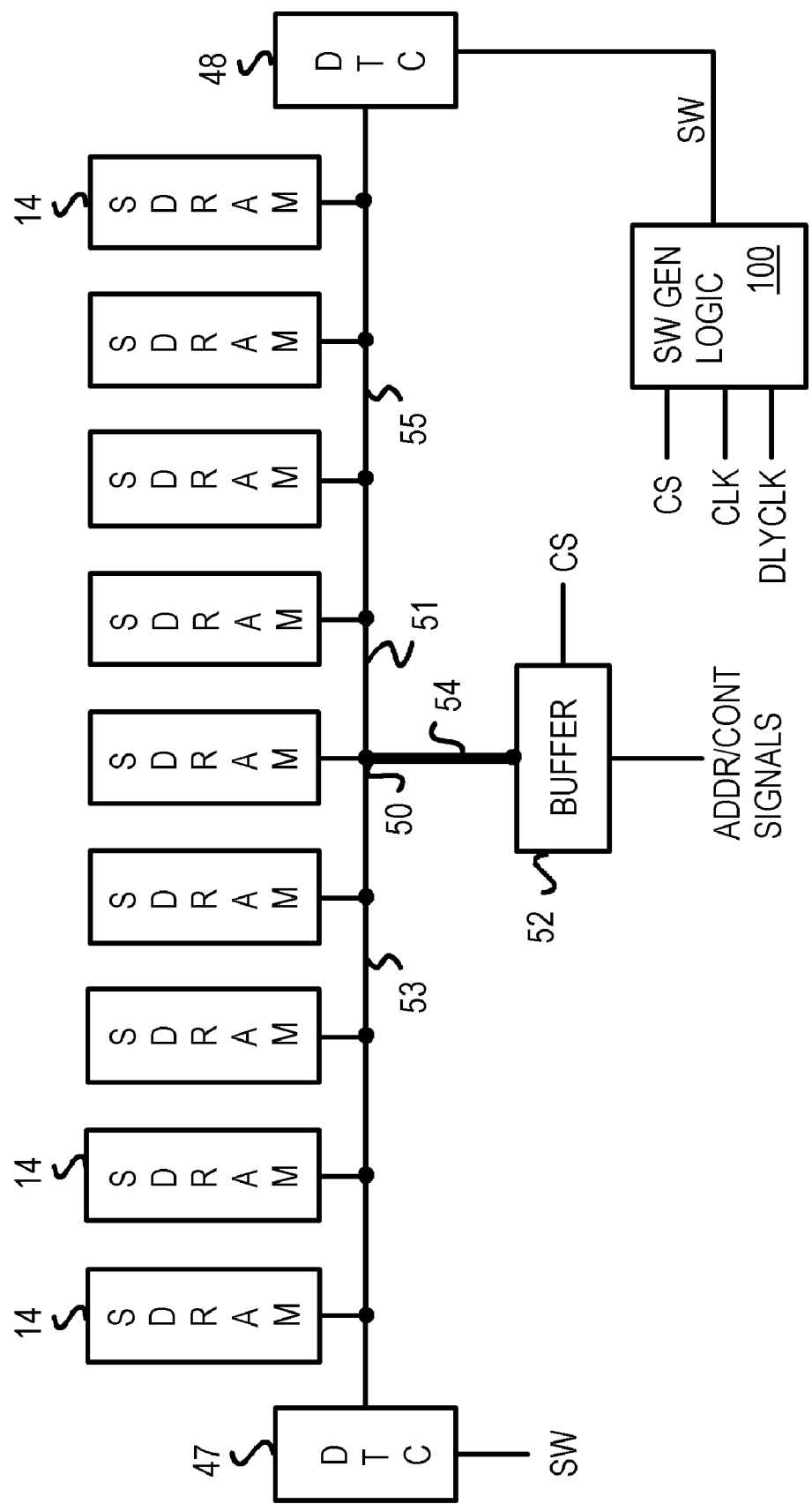
FIG. 6 shows a buffered memory module.

FIG. 6 shows a buffered memory module. To reduce loading on the chip set drivers, memory modules can include buffer 52. Signals from the chip set are input to buffer 52, which then drives traces on the memory module substrate, such as line 54. Line 54 drives inputs on all 9 DRAM chips 14. Impedance trace matching at junction 50 can be achieved by making trunk line 54 wider than branch lines 53, 55. Branch lines 53, 55 can have 60-ohm impedance while trunk line 54 as a 30-ohm impedance.

Each branch line 53, 55 has its own dynamic termination circuit. Branch line 53 is terminated by dynamic termination circuit 47, while branch line 55 is terminated by dynamic termination circuit 48. Each of dynamic termination circuits 47, 48 are as shown for dynamic termination circuit 30 in FIG. 2A.

Buffer 52 can be activated by chip select signal CS. Dynamic termination circuits 47, 48 are activated by switch signal SW, which is generated by logic 100 from CS, CLK, and DLYCLK. Buffer 52 can be a transmission gate or a high-speed buffer. Power is further reduced when using buffer 52, since address and control signals on a memory module are not toggles high or low when the module is not selected by its CS signal. Also, loading on the motherboard is reduced since inputs to DRAMs 14 are buffered by buffer 52.

Figure 7:
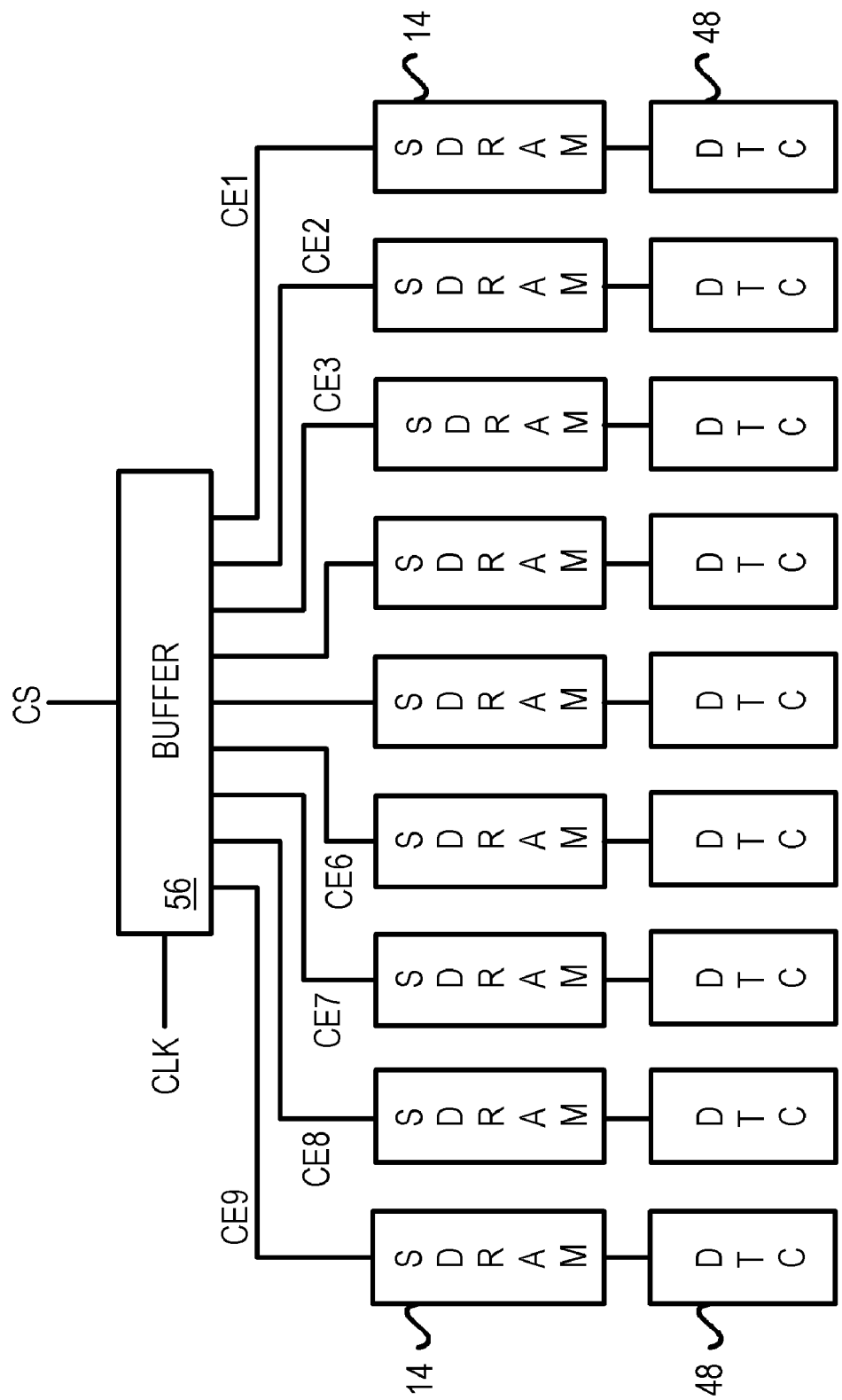
FIG. 7 shows buffering of time-critical signals on a memory module.

FIG. 7 shows buffering of time-critical signals on a memory module. Buffer 56 receives a time-critical address or control signal such as CS. Buffer 56 contains registers that are clocked by CLK and synchronize CS. CS is buffered to generate 9 separate chip-select signals CS1:CS9 that drive inputs to DRAM chips 14. Thus each output from buffer 56 drives just one DRAM chip 14. A dynamic termination circuit 48 can be attached to the end of each trace near the inputs to DRAM chips 14. Buffer 56 can include logic to generate switch signal SW.

ALTERNATE EMBODIMENTS

Several other embodiments are contemplated by the inventor. For example various logic implementations are possible. Signals can be inverted or buffered. The dynamic terminating resistor and the transmission gate can be in a reversed order but still be in series between Vtt and the far end. The clock may not have exactly a 50—50 duty cycle, but may be skewed. The amount of power savings is altered somewhat, depending on the percentage of the cycle that the SW signal is active. The SW signal can be generated by just the chip-select signal without clock timing. For design simplicity, in some multiple DIMMs applications, the time window can be continuously active for several clock cycles, or for the entire duration. The DIMM module selected by the chip set on motherboard have enabled active termination, while the active termination circuits on other DIMMs are disabled. Banks may be called Ranks in some modules.

Various derivatives of control and clock signals may be used, such as an early CS signal to generate switch signal SW. Chip-select or an early CS can be buffered to generate the SW signal. The middle voltage Vtt could be replaced by another voltage, such as 0.75 Vcc or 0.2 Vcc, or even by power or ground. Since a considerable termination current can flow when the switch is enabled, a higher-current supply for Vtt is desired. The standard Vtt supply in some memory modules does not have sufficient current drive. Thus separately generating Vtt is desirable. For example, one or more voltage dividers or voltage regulators can be used to generate Vtt from the Vdd power supply. The exact value of Vtt is not critical and can vary since the terminating voltage is used to suppress noise.

Lines can have other circuits attached, such as a small feedback buffer or latch that holds the line at the last logic level when a buffer is disabled. The signal strength can be maintained by such as small-current latch or leaker. These latches are useful when the line is no longer being driven, such as when a line's driver is in a high-impedance state (tri-stated). When a buffer disabled, its outputs are not toggling and stay at the previous logic level, allowing much power to be saved.

Various other topologies may be substituted and many variations are possible. Ideally, the equivalent impedance of the branch lines from a junction is equal to the adjusted input impedance. However, the exact impedances of branch lines may not be known or may vary somewhat. The invention is still useful when the adjusted input impedance is not exactly equal to the equivalent impedance of the branches, but is close to the equivalent impedance, such as being within 10% of the ideal. Such a closeness may be considered an impedance match, even though not exactly equal. The impedance of dynamic terminating resistor 19 can be within an order of magnitude of the line impedance and provide sufficient termination, although better termination is provided when the dynamic terminating resistor matches the line impedance to within 10%.

The trace impedance of final line segments may be increased, such as to 120 ohms, or decreased. The thickness of the input line or middle lines could be increased rather the width to reduce impedance, but this may be more complex to fabricate. More precise impedance matching can be done by more exact calculations or simulation of line geometries and chip input loads of actual memory module layouts. Measurements could be made of memory modules, or several prototype memory modules could be manufactured with slightly differing line widths and impedances and tested to determine empirically the best line widths for impedance matching.

Traces could be somewhat asymmetric. Different numbers of DRAM chips could be mounted on the module, such as 16 or 32 or 36 or some other number. DRAM chips may be mounted on both sides of the memory module, and additional distribution lines, vias, junctions may be used. Separate chip-selects could be provided for separate banks of DRAM chips on a memory module.

Buffers, latches, registers, or other devices could be added to the memory module. While the invention has been described with application to memory modules, other kinds of modules and boards could benefit from trace impedance matching, and the invention may be extended to these applications as well. Memory modules such as double-data-rate (DDR) or other formats may also be used.

The dynamic termination circuit may use discrete components mounted on the memory module substrate, or may be integrated onto a chip, or some combination, such as a bus-switch chip and external resistors. Many dynamic termination circuits may be integrated together, and may share a SW control signal. Resistors may be implemented as transistors with fixed-voltage gates. The transmission gate may be replaced with a n-channel transistor switch or with a p-channel transistor switch.

Lines may be traces in a metal layer on one of the surfaces of the module substrate, or may be on a metal layer within the substrate, or may include a combination of layers including metalized vias connecting layers.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A memory module comprising:
   a substrate with metal contact pads along an edge of the substrate for insertion into a socket on a main board;
   a plurality of memory chips mounted on the substrate;
   a terminated signal line on the substrate connected to inputs on the plurality of memory chips, the terminated signal line having a driven end that is driven by a driver on the substrate or on the main board, and a far end that is farther along the terminated signal line than is the driven end;
   a dynamic termination circuit attached to the far end of the terminated signal line, the dynamic termination circuit selectively connecting a low-impedance path to the far end in response to a switch signal being in an active state, but disconnecting the low-impedance path from the far end in response to the switch signal being in an inactive state;
   a clock signal and a chip-select signal carried by lines on the substrate, wherein the chip-select signal is activated when the main board accesses the plurality of memory chips and wherein the plurality of memory chips operate synchronously to the clock signal when the chip-select signal is activated; and
   a switch-signal generator, mounted on the substrate, receiving the chip-select signal and the clock signal, the switch-signal generator generating the switch signal in the active state synchronously to the clock signal when the chip-select signal is activated to select the plurality of memory chips for access by the main board,
   whereby the low-impedance path terminates the terminated signal line in response to the switch signal.

2. The memory module of claim 1 wherein the low-impedance path comprises:
   a low-impedance resistor; and
   a switching transistor having a channel in series with the low-impedance resistor and a gate receiving the switch signal.

3. The memory module of claim 2 wherein the low-impedance resistor has a first resistance that matches a line impedance of the terminated signal line to within an order of magnitude.

4. The memory module of claim 2 wherein the low-impedance resistor has a first resistance that matches a line impedance of the terminated signal line to within 20%.

5. The memory module of claim 2 wherein the switching transistor is an n-channel transistor.

6. The memory module of claim 5 wherein the low-impedance path further comprises:
   a p-channel transistor, having a channel in parallel with the switching transistor, the p-channel transistor having a gate receiving an inverse of the switch signal,
   whereby a transmission gate enables conduction in the low-impedance path.

7. The memory module of claim 5 wherein the low-impedance path is coupled between the far end of the terminated signal line and a fixed terminating voltage.

8. The memory module of claim 7 wherein the fixed terminating voltage is a middle voltage between a ground and a power-supply voltage.

9. The memory module of claim 8 wherein the fixed terminating voltage is about half of the power-supply voltage.

10. The memory module of claim 7 wherein the fixed terminating voltage is a ground or a power-supply voltage.

11. The memory module of claim 8 wherein the dynamic termination circuit further comprises:
a static terminating resistor coupled between the far end of the terminated signal line and the fixed terminating voltage;
wherein the static terminating resistor has a second resistance that is more than 1K ohms while a first resistance of the low-impedance resistor is less than 100 ohms.

12. The memory module of claim 11 further comprising:
a clock line on the substrate, the clock line connected to clock inputs on the plurality of memory chips, wherein the clock line carries a memory clock signal that synchronizes operation of the plurality of memory chips;
wherein the memory clock signal is the clock signal or is synchronous to the clock signal applied to the switch-signal generator.

13. The memory module of claim 12 further comprising:
a chip-select line on the substrate, the chip-select line connected to chip-select inputs on the plurality of memory chips, wherein the chip-select line is in a selected state when a controller on the main board accesses the plurality of memory chips on the substrate, but the chip-select line is in a de-selected state when the controller is not accessing the plurality of memory chips on the substrate;
wherein the chip-select line carries the chip-select signal applied to the switch-signal generator.

14. The memory module of claim 13 wherein the switch-signal generator generates a timing window that is a fraction of a clock period of the clock signal, the fraction being half or less of the clock period;
wherein the switch signal is generated in response to the timing window, wherein the switch signal is in the active state for no more than half of the clock period when the chip-select signal is activated.

15. The memory module of claim 14 wherein the switch-signal generator combines the clock signal and a delayed clock signal to generate the timing window which is combined with the chip-select signal to generate the switch signal.

16. The memory module of claim 15 wherein the delayed clock signal is delayed by about one-quarter of the clock period;
wherein the timing window is about one-quarter of the clock period;
wherein the switch signal is activated for no more than one-quarter of the clock period;
wherein power consumption by the dynamic termination circuit is reduced by at least 75% compared to an always-on termination.

17. The memory module of claim 16 wherein the terminated signal line is formed by one or more metal traces connected together, the one or more metal traces being formed on a surface of the substrate or on a layer within the substrate.

18. The memory module of claim 17 wherein the terminated signal line has a trunk segment, a first branch segment, and a second branch segment;
wherein the first branch segment connects to a first subset of the plurality of memory chips and to the dynamic termination circuit;
wherein the second branch segment connects to a second subset of the plurality of memory chips and to a second dynamic termination circuit that connects to a second far end of the second branch segment;
wherein the second dynamic termination circuit is a copy of the dynamic termination circuit;
whereby the terminated signal line is terminated at two far ends by the dynamic termination circuits.

19. The memory module of claim 18 wherein the trunk segment connects a junction of the first and second branch segments to the driven end of the terminated signal line;
wherein an impedance of the trunk segment is about equal to a sum of impedances of the first and second branch segments,
whereby the segments of the terminated signal line are trace-impedance-matched at the junction.

20. The memory module of claim 19 wherein the trunk segment comprises a metal trace having a double width;
wherein the first branch segment comprises a metal trace having a single width;
wherein the second branch segment comprises a metal trace having the single width;
wherein the double width is about twice the single width.

21. The memory module of claim 20 further comprising:
wherein the driver on the substrate drives the driven end of the terminated signal line when the chip-select signal is activated, but not driving the terminated signal line when the chip-select is not activated.

22. The memory module of claim 1 wherein the plurality of memory chips comprise a plurality of synchronous dynamic-random-access memory (DRAM) chips.

23. A memory module with low-power termination comprising:
a printed-circuit board (PCB) substrate having wiring traces formed thereon;
a clock line on the substrate for carrying a clock signal;
a chip-select line on the substrate for carrying a chip-select signal;
a plurality of synchronous memory chips, each having a clock input receiving the clock signal from the clock line and a chip-select input receiving the chip-select signal from the chip-select line and each receiving a plurality of signal inputs;
a plurality of signal lines on the substrate to the signal inputs of the plurality of synchronous memory chips, each signal line having a driven end and one or more far end;
a plurality of active terminators, each connected between a far end of one of the plurality of signal lines and a terminating voltage, the plurality of active terminators each receiving a switch signal;
wherein each active terminator in the plurality of active terminators comprises:
a static terminating resistor connected between the far end and the terminating voltage and having a resistance of 1K ohm or more;
a dynamic terminating resistor and a switch connected together in series between the far end and the terminating voltage;
wherein the dynamic terminating resistor has a resistance of less than 100 ohms and selected to approximately match an impedance of a signal line connected to the far end;
wherein the switch comprises an n-channel transistor with a gate receiving the switch signal or an inverse of the switch signal, wherein the n-channel transistor conducts current through the dynamic terminating resistor when the switch signal is activated, but prevents current flow through the dynamic terminating resistor when the switch signal is not activated; and switch timing logic, receiving the chip-select signal and the clock signal, for pulsing activate the switch signal when the chip-select signal selects the plurality of synchronous memory chips for access during a portion of a period of the clock signal.

24. The memory module with low-power termination of claim 23 wherein the switch further comprises:

a p-channel transistor in parallel with the n-channel transistor, having a gate receiving an inverse of the switch signal when the n-channel transistor has a gate receiving the switch signal, or having the gate receiving the switch signal when the n-channel transistor has a gate receiving the inverse of the switch signal, whereby a transmission gate enables current through the dynamic terminating resistor.

25. An actively-terminated memory module comprising:

substrate means, with metal contact pads along an edge of the substrate means, for insertion into a socket on a main board;

a plurality of memory chips mounted on the substrate means;

terminated signal line means, on the substrate means and connected to inputs on the plurality of memory chips, for conducting a signal from a driven end to a far end, the driven end being driven by a driver on the substrate means or on the main board, and the far end being farther along the terminated signal line means than is the driven end;

high-current resistor means for terminating the terminated signal line means with a low impedance;

switch means for selectively connecting the high-current resistor means to the far end in response to a switch signal being in an active state, but for disconnecting the high-current resistor means from the far end in response to the switch signal being in an inactive state;

a clock signal and a chip-select signal carried by lines on the substrate means, wherein the chip-select signal is activated when the main board accesses the plurality of memory chips and wherein the plurality of memory chips operate synchronously to the clock signal when the chip-select signal is activated; and switch-signal generator means, mounted on the substrate means, receiving the chip-select signal and the clock signal, the switch-signal generator means generating the switch signal in the active state synchronously to the clock signal when the chip-select signal is activated to select the plurality of memory chips for access by the main board, whereby the high-current resistor means terminates the terminated signal line means in response to the switch signal.

* * * * *